United States Patent [19]

Cullis et al.

[11] 4,392,008
[45] Jul. 5, 1983

[54] COMBINED ELECTRICAL AND THERMAL SOLAR COLLECTOR

[75] Inventors: Herbert M Cullis, Silver Spring; Reinhard Stamminger, Gaithersburg, both of Md.

[73] Assignee: Monegon, Ltd., Gaithersburg, Md.

[21] Appl. No.: 320,946

[22] Filed: Nov. 13, 1981

[51] Int. Cl.³ .......................... H01L 31/04; F24J 3/02
[52] U.S. Cl. .................................... 136/248; 126/417; 126/449
[58] Field of Search ................ 136/248, 246; 126/417, 126/449

[56] References Cited

U.S. PATENT DOCUMENTS

| | | | |
|---|---|---|---|
| 2,989,575 | 6/1961 | Wallace, Jr. | 136/246 |
| 3,866,285 | 2/1975 | Clark | 29/157 R |
| 4,069,812 | 1/1978 | O'Neill | 136/246 |
| 4,149,903 | 4/1979 | Lindmayer | 136/248 |
| 4,235,221 | 11/1980 | Murphy | 126/415 |
| 4,334,120 | 6/1982 | Yamano et al. | 136/248 |
| 4,361,717 | 11/1982 | Gilmore et al. | 136/246 |

OTHER PUBLICATIONS

S. D. Hendrie et al., "A Comparison of Theory & Experiment for Photovoltaic Thermal Collector Performance," *Conf. Record, 14th IEEE Photovoltaic Specialists Conf.* (1980), pp. 1277-1283.
P. R. Younger et al., "Combination Photovoltaic/Thermal Solar Collectors for Residential Applications," *Conf. Record, 15th IEEE Photovoltaic Specialists Conf.* (1981), pp. 959-963.
M. Simon et al., "Solar Cells with Concentrating Collectors & Integrated Heat Use System," *Proceedings 2nd European Community Photovoltaic Solar Energy Conf.* (1979), Reidel Publishing Co., pp. 541-549.

*Primary Examiner*—Aaron Weisstuch
*Attorney, Agent, or Firm*—Herman L. Gordon

[57] ABSTRACT

A solar panel assembly consisting of a shallow rectangular housing with a glass top cover, the housing enclosing a plurality of side-by-side metal plate members with depending longitudinal webs connecting the plate members to longitudinal liquid flow tubes, the plate members, webs and flow tubes being integrally formed by extrusion. Respective enlarged transverse header tubes are connected by coupling sleeves to the opposite ends of the flow tubes, the header tubes extending through and being secured in opposite side walls of the housing, so that the metal plate extrusions are supported in the housing. The plate members are interlocked in coplanar relationship by slidable tongue-and-groove connections at their longitudinal edges. Silicon photovoltaic cells are mounted in row-and-column arrays on the plate members. The depending webs are relatively deep and thin to limit the heat flow rate between the solar plate members and the flow tubes so as to prevent excessive temperature gradients and thermal stresses at the plate areas carrying the silicon cells and to thereby prevent the cells from cracking. The housing contains heat-insulating material which covers the flow tubes and covers the major portions of the header tubes.

9 Claims, 5 Drawing Figures

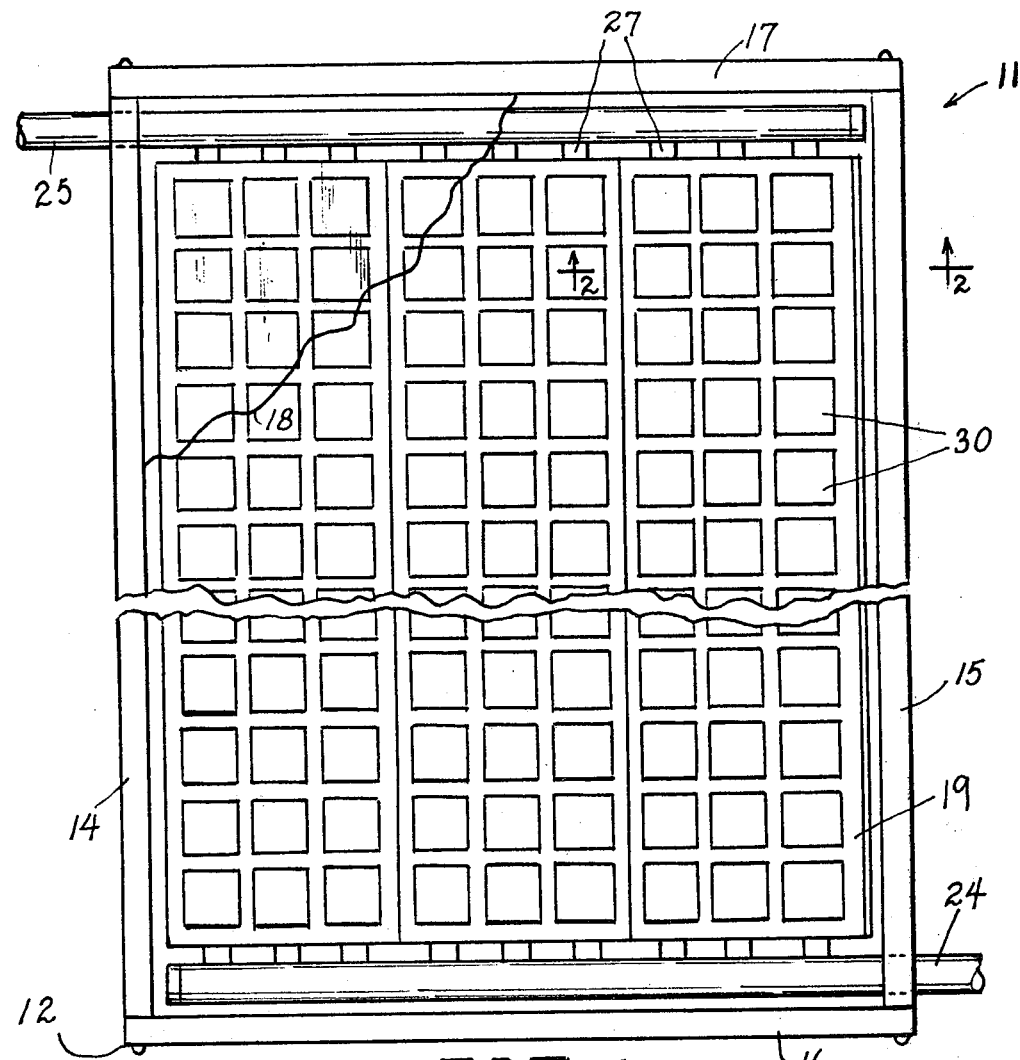
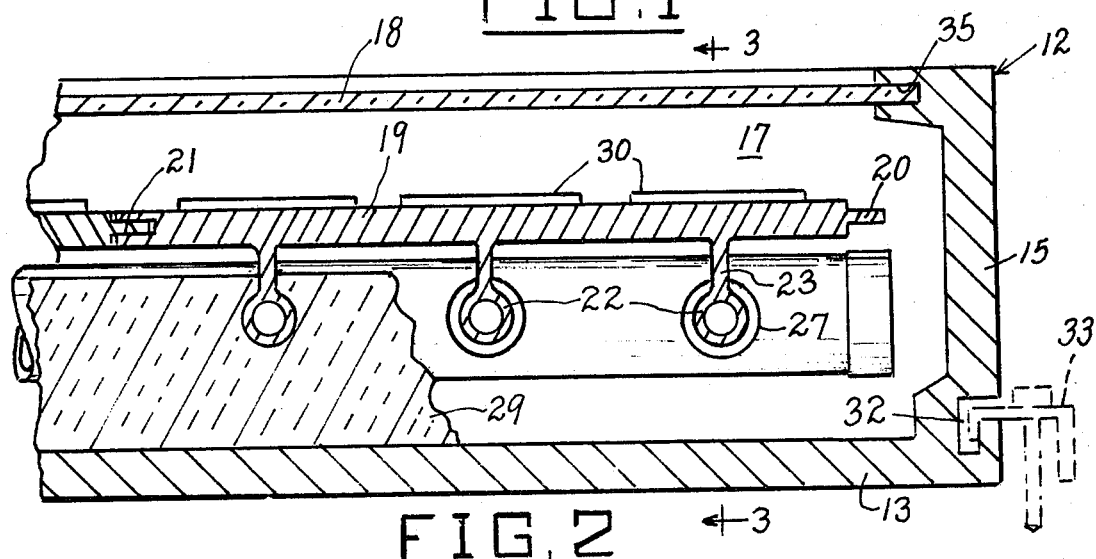

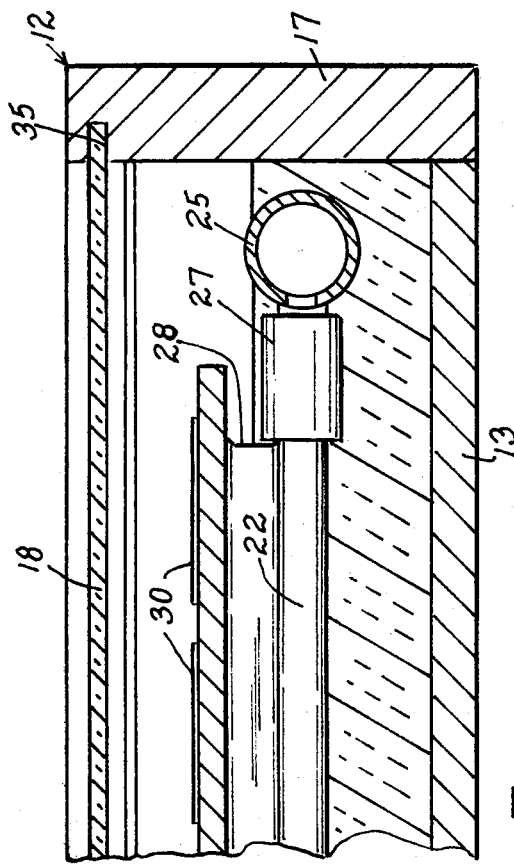
FIG.3
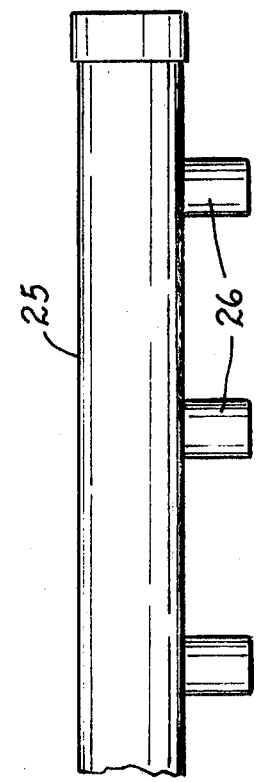
FIG.4
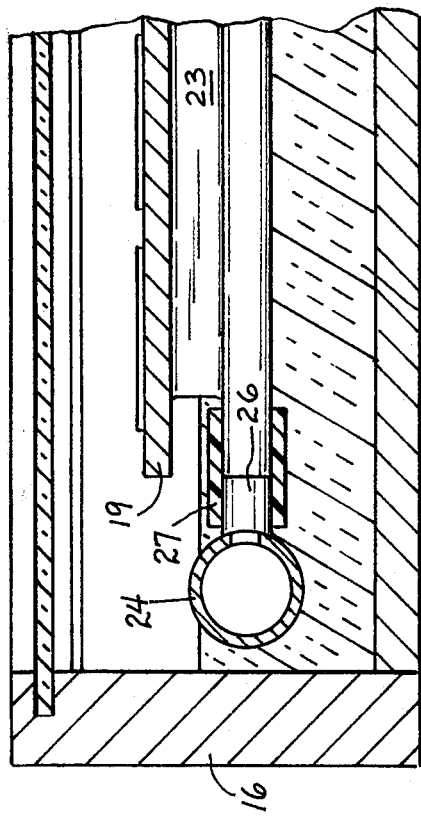
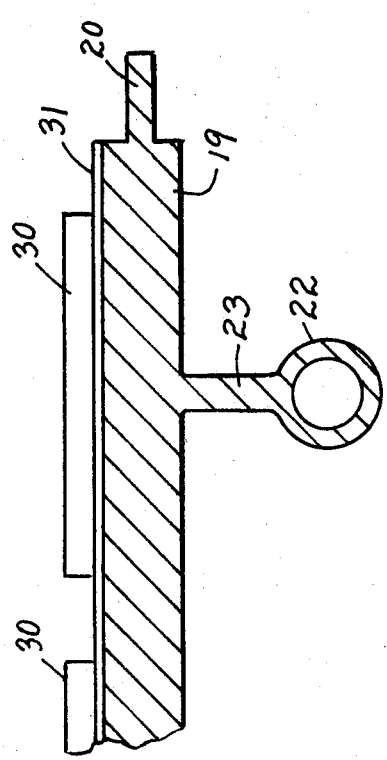
FIG.5

COMBINED ELECTRICAL AND THERMAL SOLAR COLLECTOR

FIELD OF THE INVENTION

This invention relates to solar panel assemblies, and more particularly to solar panel assemblies of the combined electrical and thermal solar collector type.

BACKGROUND OF THE INVENTION

Fluid-type flat-plate solar heat collector systems of a design employing panel units having a large number of parallel small-diameter tubes connected at their ends to larger-diameter header tubes are well known. In these systems water is pumped from a tank into the lower header tube and flows upwardly through the parallel tubes to the upper header tube and back to the tank through a return line. (In some designs the direction of flow is reversed). The tubes are bonded to a metal backing sheet, called the "plate". As both the plate and the tubes are of a conductive metal, usually copper, heat from the entire collector area is conducted to the water in the tubes, provided that the bond between the plate and tubes is highly conductive. Conductivity of the bond can vary as much as 1000 Btu per hour between a good bond and a poor one. Soldering is one of the common methods of bonding, but heat-conducting epoxy has also been used on recently developed flat-sided tube-type collectors. Because of the need for high conductivity, careful attention is required to the bonding procedure, introducing a considerable cost factor into the fabrication.

Along with utilization of collected solar heat for home heating or for heating other types of structures, electric power produced directly from sunlight is being used for household and other purposes. Cadmium sulfide (CdS) solar cells have been previously employed for this purpose, and more recently silicon-type solar cells have been developed which are highly efficient. However, the silicon cells, employed in the form of thin flat wafers, are relatively brittle and are subject to cracking when exposed to high temperature gradients, similar to the effect of a sudden temperature change caused by pouring hot liquid suddenly into a thin glass. If the water tubes are in close thermal contact with a hot solar heat-collecting plate, high temperature gradients will occur at the regions near the tubes when relatively cool water flows through the tubes.

In employing the solar cells, they are suitably cemented to the solar heat collection plate, using heat conducting but electrically insulating adhesive. By connecting groups of cells in series or parallel, almost any variety of power values can be obtained. Current from the cells is used to charge batteries that provide a direct-current supply day and night for lights. By employing inverters, alternating current may be produced for driving a variety of appliances.

At the present time there is a substantial need for providing a less expensive and more reliable fabrication technique for producing flat-plate solar heat collector units, and for providing an improved configuration which will definitely avoid high thermal stresses on electrical solar cells employed with the units.

SUMMARY OF THE INVENTION

Accordingly, a main object of the present invention is to provide a novel and improved combination electrical and thermal solar collector panel which overcomes the deficiencies of and avoids the disadvantages of the previously known solar panels.

A further object of the invention is to provide an improved solar panel assembly which is simple in construction, which is inexpensive to fabricate, and which provides high thermal conductivity between its main heat-collection plate elements and its associated liquid conduits.

A still further object of the invention is to provide an improved combination electrical and thermal solar collection assembly which converts a substantial percentage of its collected solar energy into electrical energy without subjecting its solar photovoltaic cells to excessive thermal stress and which thus avoids damage to such cells.

A still further object of the invention is to provide an improved solar panel assembly whose main components are formed of extruded metal of high thermal conductivity, the main components each including a thermal collector plate and integral heat-transfer liquid flow conduits which are readily connectable to associated header tubes forming part of a heat collection system and which serve as supports for the main components in the associated panel housing.

A still further object of the invention is to provide an improved combination electrical and thermal solar panel assembly which employs photovoltaic solar cells in the form of thin flat wafers of silicon material secured in thermal contact with main heat-collecting plates with integral heat-transfer tubes carrying a liquid heat transfer medium, the tubes being connected to the plates by integral webs arranged to attenuate the thermal gradients between the heat-collecting plates and the tubes, whereby to minimize thermal stress on the photovoltaic cells and thereby prevent cracking of the wafers.

A still further object of the invention is to provide an improved solar panel assembly including a plurality of interlocked, substantially coplanar heat-collecting plate members arranged to allow lateral expansion and contraction without causing buckling or damage to the assembly by thermal effects or by fluctuations of fluid pressure in the associated heat transfer fluid.

A still further object of the invention is to provide an improved combined thermal and electrical solar panel assembly which is highly efficient in operation, which is durable in construction, which is relatively compact in size, which is neat in appearance, which is easy to install, and which is safely operative over a wide range of temperatures.

A still further object of the invention is to provide an improved combination thermal and electrical solar panel assembly involving a minimum number of parts, including main plate components made of extruded aluminum with integral flow tubes, requiring no soldering or other means to fasten the tubes to the heat collecting plates, having integral spacer webs between the plates and the flow tubes to avoid excessive thermal stresses on the associated photovoltaic cells, and facilitating the provision of suitable clearances at the ends of the webs to facilitate the connection of the tubes to the associated header tubes by means of coupling sleeves.

BRIEF DESCRIPTION OF THE DRAWINGS

Further objects and advantages of the invention will become apparent from the following description and claims, and from the accompanying drawings, wherein:

FIG. 1 is a top plan view, partly broken away, of an improved combination electrical and thermal solar panel assembly constructed in accordance with the present invention.

FIG. 2 is an enlarged fragmentary vertical cross-sectional view taken substantially on line 2—2 of FIG. 1.

FIG. 3 is a fragmentary vertical cross-sectional view taken substantially on line 3—3 of FIG. 2.

FIG. 4 is an enlarged top plan view of an end portion of one of the header tubes employed in the panel assembly of FIG. 1.

FIG. 5 is an enlarged fragmentary vertical cross-sectional view taken substantially through a side marginal portion of one of the solar plate members employed in the panel assembly of FIG. 1.

DETAILED DESCRIPTION OF A PREFERRED EMBODIMENT

Referring to the drawings, and more particularly to FIG. 1, 11 generally designates an improved solar panel assembly constructed in accordance with the present invention. The solar panel assembly 11 comprises a generally rectangular, relatively shallow main housing 12 having a bottom wall 13, integral opposite upstanding side walls 14, 15, a transverse front wall 16 and a transverse rear wall 17. A double-strength top glass cover 18 is provided, the marginal portions of the glass cover 18 being sealingly and supportingly received in inwardly-facing grooves 35 provided in the top marginal portions of the housing walls 14, 15, 16 and 17. Bottom wall 13 and side walls 14, 15 may comprise an aluminum extrusion to the opposite ends of which the transverse walls 16 and 17 are suitably secured.

Mounted in the housing 12 substantially parallel to bottom wall 13 are a plurality of coplanar, side-by-side, elongated, generally rectangular plate members 19 which are interlocked in coplanar relationship by tongue and groove means provided on the longitudinal edges of said plate members. Thus, each plate member 19 has a longitudinal tongue rib 20 on one side edge which can be slidably received in a mating groove 21 provided in the adjacent longitudinal edge of the next plate member 19, as shown in FIG. 2. Each plate member 19 is integrally formed with a plurality of evenly spaced fluid conduits 22 integrally connected to the plate member by relatively thin depending webs 23 of substantial depth so as to limit the rate of heat flow between the plate members and the conduits 22 and to prevent the generation of high temperature gradients in the plate members in the areas above and adjacent to the webs 23. In the absence of such webs 23, the close proximity of the tubes 22 to the plate members would produce high thermal gradients in the areas of the plate members above the tubes when relatively cool liquid flows through the tubes 22 with the plate members in a relatively heated state. The provision of the thin heat-conductive webs 23 reduces the heat flow rate and prevents the generation of high thermal gradients. In a typical embodiment, the depth of the webs 23 is approximately equal to the outside diameter of the flow tubes 22 and the thickness of the webs 23 is approximately equal to twice the wall thickness of the flow tubes.

The plate members 19, webs 23 and tubes 22 are integrally formed as an extrusion of aluminum or other suitable heat-conductive material. Being integral assemblies, there is no problem of thermally bonding the flow tubes 22 to the plate members 19, since reliable thermal connections are provided by the depending webs 23. Said webs also provide longitudinal rigidity and strength for the plate-to-tube assemblies.

Respective enlarged transverse header tubes 24, 25 are provided inwardly adjacent to the transverse front and rear walls 16, 17. Header tube 24 extends through and is rigidly secured to side wall 15, and header tube 25 extends through and is rigidly secured to side wall 14. Each header tube is formed with a plurality of connection conduits 26 shaped and located to register with the ends of the respective flow tubes 22, and said flow tubes are supportingly and sealingly connected to the connection conduits 26 by coupling sleeves 27, as shown in FIG. 3. The ends of the webs 23 are notched out, as shown at 28 in FIG. 3, to provide required clearance for the coupling sleeves 27, the notching out of the webs being easy to perform since they are of relatively easily workable material, particularly where the extrusions are of aluminum. The coupling sleeves 27 are of substantial wall thickness and strength, to supportingly and securely connect the ends of the tubes 22 to the header conduits 26. The sleeves 27 may be made of sturdy resilient, heat-resistant plastic material, or of heavy-duty rubber-like heat-resistant hose which may be suitably reinforced by embedded fibers, or the like, similar to automotive radiator hose.

The lower portion of the housing cavity is filled with suitable heat-insulating material 29, such as Styrofoam, or the like, to a depth such as to cover the flow tubes 22 and the major portions of the header tubes 24, 25, acting also to provide cushioned support for the plate-and-tube assembly comprising the plate members 19 and parts associated therewith.

The coupling sleeves 27 may be sealingly locked to the conduits 26 and the tubes 22 in any suitable manner, as by means of epoxy cement or similar heat-resistant adhesive material, or by conventional clamps.

Mounted on each plate member 19 in heat-transfer relation thereto is an array of photovoltaic cells 30, such as thin wafers of the silicon type, arranged in a plurality of rows and columns, as shown in FIG. 1. The flat cells 30 are cemented onto the plate members 19, for example, using epoxy resin. The aluminum plate members 19 are anodized to form a heat-conductive, electrically insulating layer 31 from 0.0002 to 0.0005 inch in thickness (FIG. 5), whereby the plate members 19 define heat sinks for the photovoltaic chips 30.

As previously mentioned, the relatively fragile silicon wafers 30 are protected against thermal stresses by the nearby, substantially centered presence of the heat flow-attenuating relatively thin transmission webs 23 thermally coupling the plate members 19 to the flow tubes 22. The photovoltaic cells may be connected electrically in any suitable network configuration. In a typical installation, the longitudinally aligned cells are connected in series, and the respective series circuits are connected in parallel, to supply charging current to the batteries of the system.

In a typical installation, the plate members 19 are about 1 foot wide and about 6 feet long, reasonable clearance for expansion and contraction being provided by their slidable tongue and groove connection.

As shown in FIG. 2, the lower outside portions of the side walls 14, 15 are provided with inverted L-shaped, upwardly flanged, grooves 32 to receive flanged anchor clamps 33 for fastening the solar panel assembly 11 to a roof surface, or to any other desired flat solar exposure surface.

While a specific embodiment of an improved combined electrical and thermal solar collector assembly has been disclosed in the foregoing description, it will be understood that various modifications within the scope of the invention may occur to those skilled in the art. Therefore it is intended that adaptations and modifications should and are intended to be comprehended within the meaning and range of equivalents of the disclosed embodiment.

What is claimed is:

1. A solar panel assembly comprising support means defining an enclosure, flat solar collector plate means mounted in said enclosure, photovoltaic cell means including at least one thin semi-conductor wafer mounted on said plate means, flow tube means in the enclosure below said plate means, thin perpendicularly depending heat-conductive web means rigidly connecting said plate means to said flow tube means and being located immediately subjacent said photovoltaic cell means, respective fluid inlet and outlet header means secured in said enclosure, and means communicatively connecting said inlet and outlet header means to opposite ends of said flow tube means, wherein said flow tube means comprises a plurality of parallel flow tubes below said plate means, wherein said web means comprises respective depending thin heat-conducting perpendicularly depending webs connecting said plate means to said flow tubes, and wherein said photovoltaic cell means includes a plurality of photovoltaic silicon semi-conductor wafers mounted on the plate means immediately adjacent to and substantially centered above the locations of said heat-conducting webs.

2. The solar panel assembly of claim 1, and wherein said semi-conductor wafers comprise flat bodies of photovoltaic silicon.

3. The solar panel assembly of claim 1, and wherein said plate means, web means and flow tube means are integral and are formed by extrusion.

4. The solar panel assembly of claim 1, and wherein said plate means comprises a plurality of substantially coplanar side-by-side heat conductive plate members.

5. The solar panel assembly of claim 4, and wherein said side-by-side plate members include a plate member formed with a longitudinal edge groove and an adjacent plate member having a longitudinal edge rib slidably received in said groove.

6. The solar panel assembly of claim 1, and wherein said plate means, web means and flow tube means are integral and are formed as an extrusion, and wherein said web means is provided at the opposite ends of the flow tube means with notches, and wherein the means communicatively connecting the inlet and outlet header means to the flow tube means are received in said notches.

7. The solar panel assembly of claim 1, and wherein said inlet and outlet header means include conduit elements on the header means aligned with the ends of the flow tubes, and wherein the means comnunicatively connecting the inlet and outlet header means to the opposite ends of the flow tube means comprises respective coupling sleeves engaged on the aligned conduit elements and ends of the flow tubes.

8. The solar panel assembly of claim 7, and wherein the ends of the webs are formed with notches receiving said coupling sleeves.

9. The solar panel assembly of claim 1, and wherein the depth of the web means is approximately equal to the outside diameter of the flow tube means and the thickness of the web means is approximately equal to twice the wall thickness of the flow tube means.

* * * * *